(12) United States Patent
Takemura

(10) Patent No.: US 8,017,309 B2
(45) Date of Patent: Sep. 13, 2011

(54) METHOD OF MANUFACTURING WIRING CIRCUIT BOARD

(75) Inventor: Keiji Takemura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 379 days.

(21) Appl. No.: 12/385,548

(22) Filed: Apr. 10, 2009

(65) Prior Publication Data

US 2009/0263748 A1 Oct. 22, 2009

(30) Foreign Application Priority Data

Apr. 18, 2008 (JP) ................... 2008-109290

(51) Int. Cl.
*G03F 7/00* (2006.01)

(52) U.S. Cl. ........ 430/322; 430/311; 430/317; 430/318; 430/324; 430/325

(58) Field of Classification Search .............. 430/270.1, 430/311, 313, 314, 317, 318, 322, 324, 325
See application file for complete search history.

(56) References Cited

U.S. PATENT DOCUMENTS

| | | | |
|---|---|---|---|
| 6,506,688 B2 * | 1/2003 | Wu ................... | 438/759 |
| 7,566,833 B2 * | 7/2009 | Ishii et al. ............ | 174/254 |
| 2005/0186332 A1 * | 8/2005 | Funada et al. ........ | 427/96.1 |
| 2006/0269730 A1 | 11/2006 | Ishii et al. | |
| 2007/0128554 A1 * | 6/2007 | Kawamura et al. ...... | 430/311 |
| 2007/0131449 A1 * | 6/2007 | Funada et al. ......... | 174/254 |
| 2009/0202949 A1 * | 8/2009 | Takemura ............. | 430/314 |

FOREIGN PATENT DOCUMENTS

| | | |
|---|---|---|
| EP | 1519640 | 3/2005 |
| EP | 2091309 | 8/2009 |
| JP | 2006-332549 | 12/2006 |

* cited by examiner

*Primary Examiner* — Amanda C. Walke
(74) *Attorney, Agent, or Firm* — Jean C. Edwards, Esq.; Edwards Neils PLLC

(57) ABSTRACT

A method of manufacturing a wiring circuit board includes: preparing an insulating layer; forming conductive thin films on the upper surface and the side end surface of the insulating layer; covering the conductive thin films formed on the upper surface and the side end surface of the insulating layer with photoresists; arranging a photomask so that an end portion and a portion to be provided with a conductive layer in the conductive thin film formed on the upper surface of the insulating layer are shaded and exposing the photoresist covering the conductive thin film formed on the upper surface of the insulating layer from above through the photomask; exposing the photoresist covering the conductive thin film formed on the side end surface of the insulating layer from below; forming plating resists by removing unexposed portions of the photoresists so as to form exposed portions into patterns; forming an end portion conductive layer on the end portion of the conductive thin film formed on the upper surface of the insulating layer, and forming the conductive layer on the conductive thin film formed on the upper surface of the insulating thin film at the same time, on the conductive thin films exposed from the plating resists; removing the plating resists; and removing the conductive thin films having been covered with the plating resists.

6 Claims, 10 Drawing Sheets

(a)

(b)

(c)

(d)

(h)

(i)

(j)

(a)

(b)

(c)

(d)

(e)

(f)

(g)

(h)

(i)

(j)

(a)

(b)

(c)

METHOD OF MANUFACTURING WIRING CIRCUIT BOARD

CROSS REFERENCE TO RELATED APPLICATION

The present application claims priority from Japanese Patent Application No. 2008-109290 filed on Apr. 18, 2008, the content of which is hereby incorporated by reference in its entirety.

BACKGROUND OF THE INVENTION

1. Field of the Invention

The present invention relates to a method of manufacturing a wiring circuit board, and more specifically, it relates to a method of manufacturing a wiring circuit board such as a COF board.

2. Description of Related Art

In general, an additive process is employed for forming a conductive pattern of a wiring circuit board such as a COF board. For example, there is proposed an additive process of forming a conductive thin film made of chromium and copper on an insulating base layer made of polyimide and forming a conductive pattern made of copper on the conductive thin film (refer to Japanese Unexamined Patent Publication No. 2006-332549, for example).

According to the aforementioned Japanese Unexamined Patent Publication No. 2006-332549, the conductive thin film is formed on the overall surface of the insulating base layer by sputtering. Then, the conductive thin film is covered with a negative dry film resist, thereafter exposed from above through a photomask and then developed, thereby forming a plating resist in a reversal pattern of a wiring circuit pattern. Then, the conductive pattern is formed on the surface of the conductive thin film exposed from the plating resist by deposition of copper by electrolytic copper plating.

SUMMARY OF THE INVENTION

In the additive process, however, conductive thin films formed on side end surfaces of the insulating base layer must be covered with plating resists so that copper is not deposited.

In other words, the conductive thin films formed on the side end surfaces of the insulating base layer are easily non-uniformly formed as compared with the conductive thin film formed on the upper surface of the insulating base layer. If copper is deposited on the conductive thin films formed on the side end surfaces of the insulating base layer, the copper is easily separated from the side end surfaces of the insulating base layer along with the conductive thin films, to disadvantageously form foreign matter. In order to prevent deposition and separation of copper on the side end surfaces of the insulating base layer, therefore, the conductive thin films formed on the side end surfaces of the insulating base layer must be covered with the plating resists.

On the other hand, the dry film resist is generally stacked by thermocompression bonding, and hence pressing force is intensively applied to end edges of the end portions of the conductive thin film formed on the upper surface of the insulating base layer. Therefore, the thicknesses of the end edges are reduced, and the dry film resist may slip down on the surfaces of the conductive thin films formed on the side end surfaces of the insulating base layer. When the dry film resist slips down, narrow defective portions (voids) lacking the dry film resist are formed in the dry film resist on the end edges of the end portions of the conductive thin film formed on the upper surface of the insulating base layer. When electrolytic copper plating is performed with a plating resist prepared from such a dry film resist, copper is deposited from the conductive thin film in the defective portions of the photoresist. Therefore, such copper is relatively narrowly formed and hence has low adhesion to the insulating base layer and is separated from the insulating base layer along with the conductive thin films to disadvantageously form foreign matter. Therefore, a technique of intentionally providing wide copper layers on the end portions of the conductive thin film formed on the upper surface of the insulating base layer thereby preventing the aforementioned deposition of narrow copper and improving adhesion between the copper layers and the insulating base layer is desired.

In order to prevent formation of the aforementioned foreign matter, therefore, the conductive thin films formed on the side end surfaces of the insulating base layer must be covered with plating resists, and the end portions of the conductive thin film formed on the upper surface of the insulating base layer must be exposed from the plating resists so that wide copper layers are formed. In this case, a mask pattern must be provided so that dry film resists corresponding to the portions of the conductive thin films formed on the side end surfaces of the insulating base layer are exposed in order to form the plating resists from the negative dry film resists while dry film resists corresponding to the portions of the end portions of the conductive thin film formed on the upper surface of the insulating base layer are not exposed in order to form wide copper layers. However, it is difficult to correctly arrange the photomask so that the conductive thin films formed on the side end surfaces of the insulating base layer are exposed and the end portions of the conductive thin film formed on the upper surface of the insulating base layer are not exposed.

An object of the present invention is to provide a method of manufacturing a wiring circuit board capable of simply preventing formation of conductive foreign matter on a side end surface of an insulating layer while preventing formation of conductive foreign matter on an end portion of the upper surface of the insulating layer.

The method of manufacturing a wiring circuit board according to the present invention includes: preparing an insulating layer; forming conductive thin films on the upper surface and the side end surface of the insulating layer; covering the conductive thin films formed on the upper surface and the side end surface of the insulating layer with photoresists; arranging a photomask so that an end portion and a portion to be provided with a conductive layer in the conductive thin film formed on the upper surface of the insulating layer are shaded and exposing the photoresist covering the conductive thin film formed on the upper surface of the insulating layer from above through the photomask; exposing the photoresist covering the conductive thin film formed on the side end surface of the insulating layer from below; forming plating resists by removing unexposed portions of the photoresists so as to form exposed portions into patterns; forming an end portion conductive layer on the end portion of the conductive thin film formed on the upper surface of the insulating layer, and forming the conductive layer on the conductive thin film formed on the upper surface of the insulating thin film at the same time, on the conductive thin films exposed from the plating resists, removing the plating resists; and removing the conductive thin films having been covered with the plating resists.

According to the method, the conductive thin film is formed on the upper surface of the insulating layer, the conductive thin film formed on the upper surface of the insulating layer is covered with the photoresist, the photomask is arranged so that the end portion and the portion to be provided with the conductive layer in the conductive thin film formed on the upper surface of the insulating layer are shaded, and the photoresist covering the conductive thin film formed on the upper surface of the insulating layer is exposed from above through the photomask. Then, unexposed portions of the photoresist are formed on the end portion and the portion to be provided with the conductive layer in the conductive thin film formed on the upper surface of the insulating layer. When the plating resist is formed the unexposed portions of the photoresist are removed, the end portion conductive layer can be formed on the end portion, exposed from the plating resist, of the conductive thin film formed on the upper surface of the insulating layer. At the same time, the conductive layer can be formed on the portion, exposed from the plating resist, other than the end portion conductive layer of the conductive thin film formed on the upper surface of the insulating layer. Therefore, deposition of a narrow conductor material can be prevented and adhesion between the end portion conductive layer and the insulating layer can be improved by forming the end portion conductive layer on the end portion of the conductive thin film formed on the upper surface of the insulating layer while the conductive layer can be formed. Consequently, a wiring circuit board having high connection reliability can be obtained by preventing formation of conductive foreign matter on the end portion of the upper surface of the insulating layer.

According to the method, on the other hand, the conductive thin film is formed on the side end surface of the insulating layer, the conductive thin film formed on the side end surface of the insulating layer is covered with the photoresist, and the photoresist can be exposed from below through the conductive thin film serving as a mask. Therefore, the photoresist covering the conductive thin film formed on the side end surface of the insulating layer can be simply exposed. Then, the plating resist can be formed from the exposed portion to cover the conductive thin film formed on the side end surface of the insulating layer. Therefore, deposition of the conductor material can be simply prevented in the conductive thin film formed on the side end surface of the insulating layer, and formation of conductive foreign matter on the side end surface of the insulating layer can be simply prevented as a result.

Preferably in the method of manufacturing a wiring circuit board according to the present invention, the conductive thin film is formed by sputtering in the step of forming the conductive thin films.

In general, the conductive thin film formed on the side end surface of the insulating layer is easily non-uniformly formed in particular as compared with the conductive thin film formed on the upper surface of the insulating layer when the conductive thin films are formed by sputtering. If a conductive layer is formed on the conductive thin film formed on the side end surface of the insulating layer, therefore, the conductive layer is particularly easily separated from the side end surface of the insulating layer along with the conductive thin film, to form foreign matter.

According to the method, however, the photoresist covering the conductive thin film formed on the side end surface of the insulating layer is exposed from below and the conductive thin film formed on the side end surface of the insulating layer can be covered with the plating resist of the exposed portion even if the conductive thin films are formed by sputtering. Therefore, separation of the conductive layer from the side end surface of the insulating layer along with the conductive thin film can be reliably prevented.

Preferably in the method of manufacturing a wiring circuit board according to the present invention, a two-layer substrate formed by stacking the insulating layer on a metal supporting layer is prepared in the step of preparing the insulating layer, the conductive thin films are formed on the upper surface of the insulating layer and the side end surfaces of the insulating layer and the metal supporting layer in the step of forming the conductive thin films, the conductive thin film formed on the upper surface of the insulating layer and the conductive thin film formed on the side end surfaces of the insulating layer and the metal supporting layer are covered with the photoresists in the step of covering the conductive thin films with the photoresists, and the photoresist covering the conductive thin film formed on the side end surfaces of the insulating layer and the metal supporting layer is exposed from below in the step of exposing the photoresist from below.

According to the method, the two-layer substrate formed by stacking the insulating layer on the metal supporting layer is prepared, whereby the insulating layer can be reinforced with the metal supporting layer. Therefore, a conductive pattern can be precisely formed.

The conductive thin film is formed on the side end surfaces of the insulating layer and the metal supporting layer, the conductive thin film formed on the side end surfaces of the insulating layer and the metal supporting layer is covered with the photoresist, and the photoresist can be exposed from below through the metal supporting layer and the conductive thin film formed on the side end surfaces of the insulating layer and the metal supporting layer as masks. Therefore, only the photoresist formed on the side end surfaces of the insulating layer and the metal supporting layer can be simply and reliably exposed.

Preferably in the method of manufacturing a wiring circuit board according to the present invention, the photoresist are prepared from a dry film resist.

If a dry film resist is stacked on the conductive thin film formed on the upper surface of the insulating layer, pressing force based on thermocompression bonding is intensively applied to an end edge of the end portion of the conductive thin film formed on the upper surface of the insulating layer, and hence a defective portion is easily formed. Therefore, a narrow conductor material resulting from the defective portion is disadvantageously unintentionally deposited in the formation of the conductive layer.

According to the method, however, the photomask is arranged so that the end portion of the conductive thin film formed on the upper surface of the insulating layer is shaded as hereinabove described after the photoresist is prepared from the dry film resist, and the photoresist is exposed from above through the photomask. Therefore, deposition of a narrow conductor material can be prevented and adhesion between the end portion conductive layer and the insulating layer can be improved by intentionally forming the end portion conductive layer on the end portion of the conductive thin film formed on the upper surface of the insulating layer while the conductive layer can be formed. Consequently, a wiring circuit board having high connection reliability can be obtained by preventing formation of conductive foreign matter on the end portion of the upper surface of the insulating layer.

Preferably in the method of manufacturing a wiring circuit board according to the present invention, a resin supporting layer is stacked under the insulating layer to include the photoresist covering the conductive thin film formed on the side end surface of the insulating layer in the step of covering the conductive thin films with the photoresists.

According to the method, the conductive thin film formed on the side end surface of the insulating layer can be easily and reliably covered by stacking the photoresist on the resin supporting layer simultaneously with the stacking of the resin supporting layer.

The insulating layer can be reinforced with the resin supporting layer and provided with toughness, whereby the conductive pattern can be precisely formed.

Preferably, the method of manufacturing a wiring circuit board according to the present invention further includes a step of heating the photoresist covering the conductive thin film formed on the side end surface of the insulating layer after the step of covering the conductive thin films with the photoresists.

In general, bubbles may be formed in the photoresist covering the conductive thin film formed on the side end surface of the insulating layer after the step of covering the conductor thins film with the photoresists. According to the method, however, the photoresist covering the conductive thin film formed on the side end surface of the insulating layer is heated after the step of covering the conductive thin films with the photoresists, whereby the number or the volumes of such bubbles can be reduced, and the bubbles can be removed.

BRIEF DESCRIPTION OF THE DRAWINGS

FIG. 2(a) shows a step of preparing a two-layer substrate, FIG. 2(b) shows a step of forming conductive thin films, FIG. 2(c) shows a step of forming a resin supporting layer simultaneously with formation of photoresists, and FIG. 2(d) shows a step of exposing the photoresist from above through a photomask.

FIG. 3(e) shows a step of exposing the photoresists from below, FIG. 3(f) shows a step of removing unexposed portions of the photoresists, forming exposed portions into patterns and forming plating resists, and FIG. 3(g) shows a step of simultaneously forming end portion conductive layers and a conductive layer.

FIG. 4(h) shows a step of successively removing the plating resists and the conductive thin films of portions having been covered with the plating resists, FIG. 4(i) shows a step of forming an insulating cover layer on the insulating base layer, and FIG. 4(j) shows a step of removing the resin supporting layer.

FIG. 6(a) shows a step of preparing an insulating base layer, FIG. 6(b) shows a step of forming conductive thin films, FIG. 6(c) shows a step of forming a resin supporting layer simultaneously with formation of photoresists, and FIG. 6(d) shows a step of exposing the photoresists from above through a photomask.

FIG. 7(e) shows a step of exposing the photoresists from below, FIG. 7(f) shows a step of removing unexposed portions o the photoresists, forming exposed portions into patterns and forming plating resists, and FIG. 7(g) shows a step of simultaneously forming end portion conductive layers and a conductive layer.

FIG. 8(h) shows a step of successively removing the plating resists and conductive thin films of portions having been covered with the plating resists, FIG. 8(i) shows a step of forming an insulating cover layer on an insulating base layer, and FIG. 8(j) shows a step of removing a resin supporting layer.

FIG. 9(a) shows a step of arranging a photomask so that only a portion at the width-directional center to be provided with a conductive layer is shaded and exposing photoresists from above through the photomask, FIG. 9(b) shows a step of removing unexposed portions of the photoresists, forming exposed portions into patterns and forming plating resists, and FIG. 9(c) shows a step of forming the conductive layer.

FIG. 10(a) shows a step of arranging a photomask so that only a portion to be provided with a conductive layer at the width-directional center and portions to be provided end portion conductive layers on both width-directional end portions are shaded and exposing a photoresist from above through the photomask, FIG. 10(b) shows a step of removing unexposed portions of the photoresist, forming exposed portions into patterns and forming plating resists, and FIG. 10(c) shows a step of forming the conductive layer and the end portion conductive layers.

DETAILED DESCRIPTION OF PREFERRED EMBODIMENTS

Figure 1:
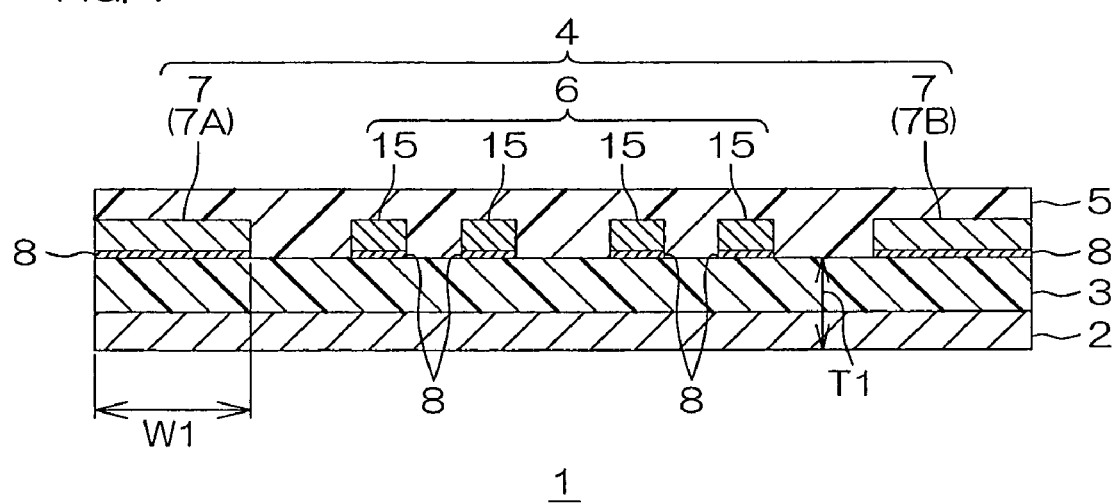
FIG. 1 is a sectional view of a wiring circuit board (in a mode including a metal supporting layer) manufactured according to an embodiment of a method of manufacturing a wiring circuit board according to the present invention along a width direction.
Figure 2:
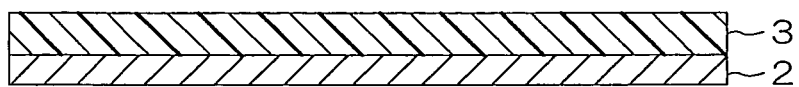
FIG. 2 are step diagrams of the embodiment of the method of manufacturing a wiring circuit board according to the present invention.
Figure 2:
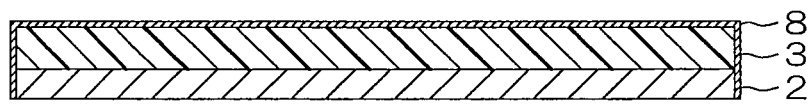
Figure 2:
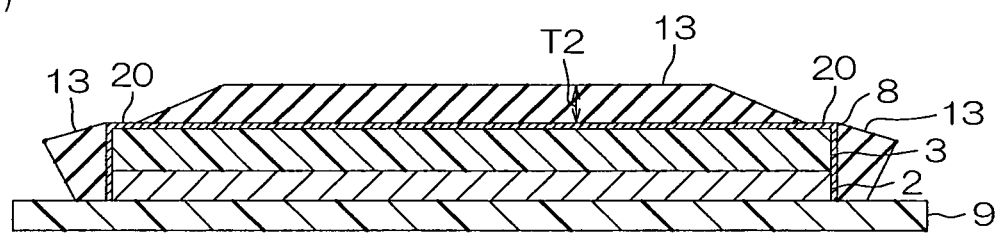
Figure 2:
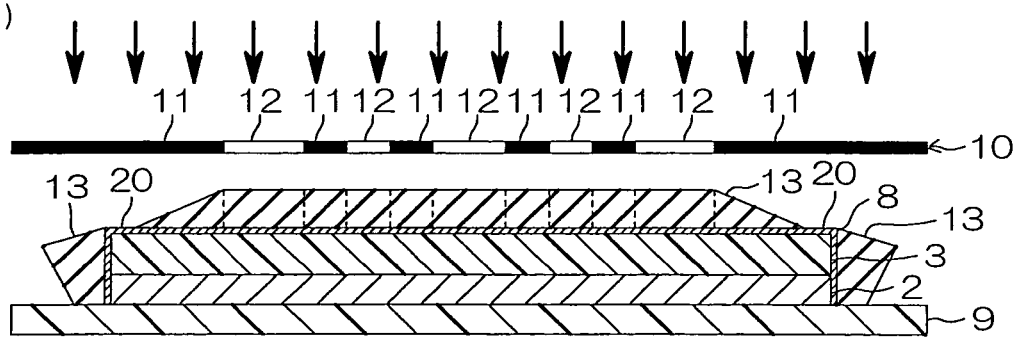
Figure 3:
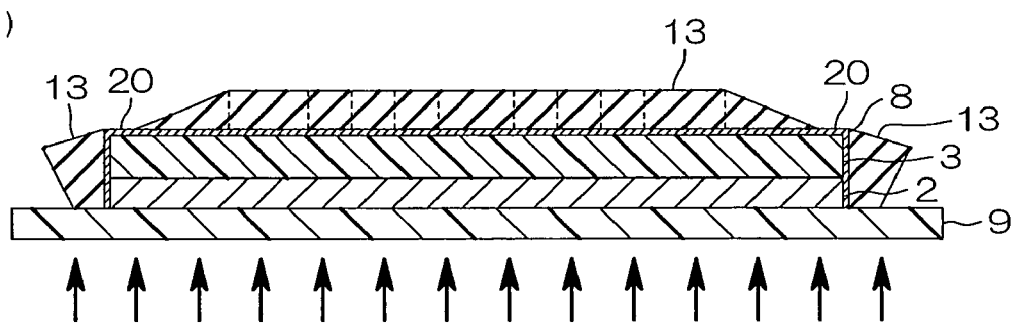
FIG. 3 are step diagrams of the embodiment of the method of manufacturing a wiring circuit board according to the present invention subsequent to FIG. 2.
Figure 3:
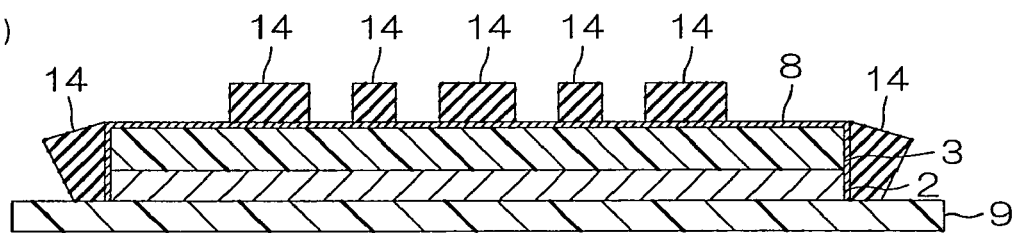
Figure 3:
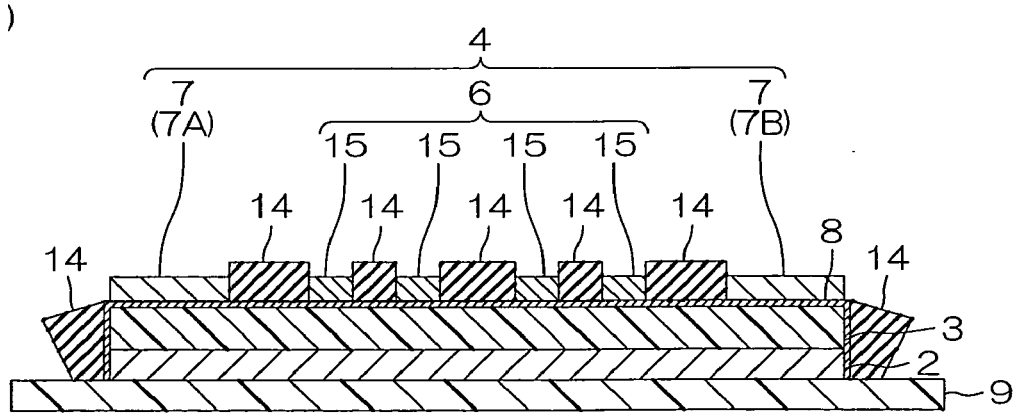
Figure 4:
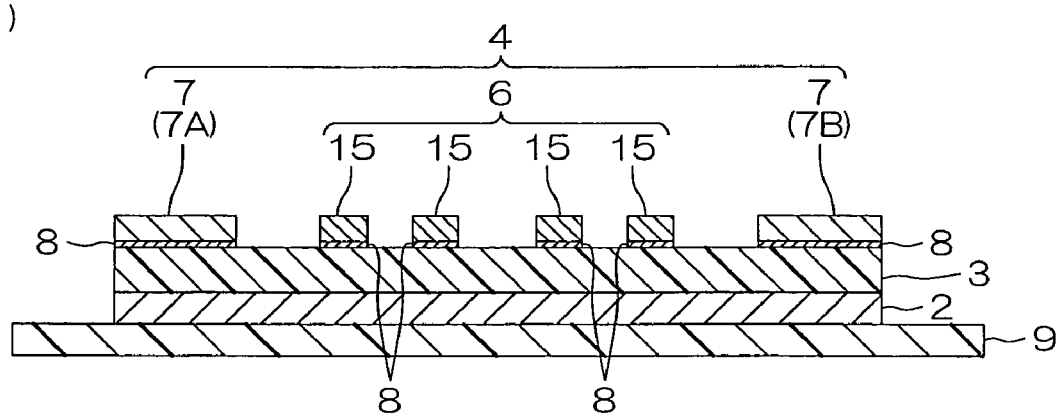
FIG. 4 are step diagrams of the embodiment of the method of manufacturing a wiring circuit board according to the present invention subsequent to FIG. 3.
Figure 4:
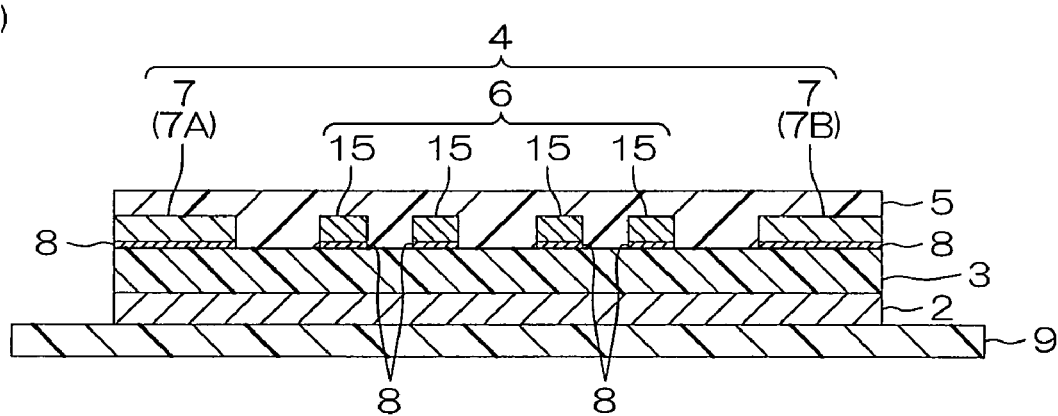
Figure 4:
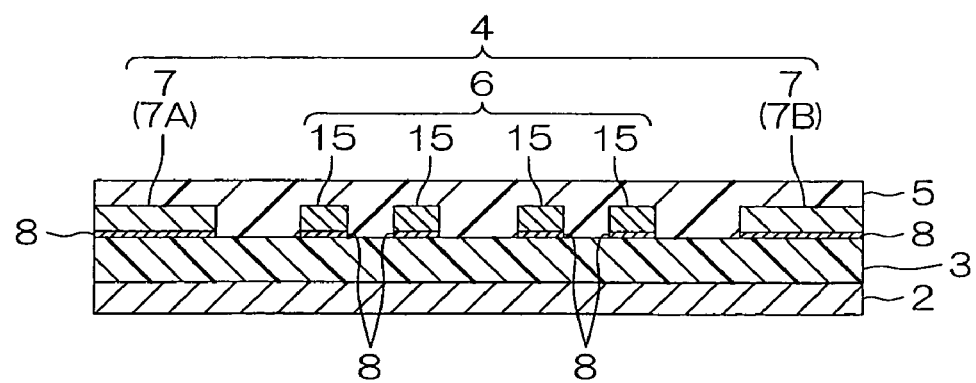

FIG. 1 is a sectional view of a wiring circuit board (in a mode including a metal supporting layer) manufactured according to an embodiment of a method of manufacturing a wiring circuit board according to the present invention along a width direction, and FIGS. 2 to 4 are step diagrams of the embodiment of the method of manufacturing a wiring circuit board according to the present invention.

Referring to FIG. 1, a wiring circuit board 1 is a COF board mounted with an IC chip (not shown) and loaded on an electronic apparatus, and includes a metal supporting layer 2 extending in the longitudinal direction and an insulating base layer 3 as an insulating layer formed on the metal supporting layer 2. The wiring circuit board 1 further includes conductive thin films 8 formed on the insulating base layer 3, a conductive pattern 4 formed on the conductive thin films 8, and an insulating cover layer 5 formed on the insulating base layer 3 to cover the conductive thin films 8 and the conductive pattern 4.

The metal supporting layer 2 is a reinforcing layer. Stainless, 42 alloy or the like is employed as a metallic material forming the metal supporting layer 2, and stainless is preferably employed.

The metal supporting layer 2 consists of a metal foil or a metal thin plate in the form of a flat plate. The thickness of the metal supporting layer 2 is 5 to 100 µm, for example, and preferably 10 to 50 µm.

The insulating base layer 3 is formed on the surface of the metal supporting layer 2. More specifically, the insulating base layer 3 is formed on the overall upper surface of the metal supporting layer 2 over a width direction (a direction orthogonal to the longitudinal direction). In other words, width-directional end edges of the insulating base layer 3 are formed on the same positions as those of the metal supporting layer 2 in plan view. That is, both width-directional side end surfaces of the insulating base layer 3 are formed to be flush with both width-directional side end surfaces of the metal supporting layer 2 in a thickness direction.

Synthetic resin such as polyimide, polyether nitrile, polyether sulfone, polyethylene terephthalate, polyethylene naphthalate, polyvinyl chloride or the like, for example, is employed as an insulating material forming the insulating base layer 3. Among these, polyimide is preferably employed.

The thickness of the insulating base layer 3 is 1 to 50 µm, for example, and preferably 20 to 40 µm. Thus, the total thickness T1 of the metal supporting layer 2 and the insulating base layer 3 is set to 6 to 150 µm, for example, and preferably 30 to 90 µm.

The conductive thin films 8 are seed films formed by a semi-additive process described later, and formed on the upper surface of the insulating base layer 3. In other words, the conductive thin films 8 are formed in the same pattern as the conductive pattern 4 in plan view.

A conductive material such as copper or chromium, for example, is employed for forming the conductive thin films 8. The thickness of each conductive thin film 8 is 20 to 500 nm, for example, and preferably 50 to 300 nm.

The conductive pattern 4 is formed on the upper surfaces of the conductive thin films 8, and side edges of the conductive pattern 4 are formed on the same positions as those of the conductive thin films 8 in plan view. In other words, the side end surfaces of the conductive pattern 4 are formed to be flush with those of the conductive thin films 8 in the thickness direction.

The conductive pattern 4 includes a conductive layer 6 and end portion conductive layers 7.

The conductive layer 6 is provided on a width-directional intermediate portion on the insulating base layer 3. In other words, the conductive layer 6 is arranged at intervals from end edges of both width-directional end portions, so that regions (both width-directional end portions) provided with the end portion conductive layers 7 are ensured. More specifically, the conductive layer 6 is formed on a generally central portion in the width direction. The conductive layer 6 is formed as a wiring circuit pattern integrally including a plurality of wires 15 extending along the longitudinal direction and parallelly arranged at intervals from one another in the width direction and terminal portions (not shown) continuous to both end portions of each wire 15 in the longitudinal direction.

The end portion conductive layers 7 are provided on both width-directional end portions on the insulating base layer 3, and opposed to outermost wires 15 in the width direction at intervals on both outer sides of the conductive layer 6 in the width direction. Each end portion conductive layer 7 is formed in a pattern parallel to the corresponding width-directional end edge of the insulating base layer 3, and has a generally rectangular flat section. Width-directional outer end edges of the end portion conductive layers 7, i.e., a first width-directional side end edge of a first end portion conductive layer 7A arranged on a first width-directional side and a second width-directional side end edge of a second end portion conductive layer 7B arranged on a second width-directional side are formed on the same positions as both width-directional side end edges of the insulating base layer 3 in plan view. In other words, a first width-directional side end surface of the first end portion conductive layer 7A and a second width-directional side end surface of the second end portion conductive layer 7B are formed to be flush with both width-directional side end surfaces of the insulating base layer 3 respectively in the thickness direction.

Copper, nickel, gold, solder or an alloy thereof, for example, is employed as a conductive material forming the conductive pattern 4. Preferably, copper is employed.

The width of each wire 15 is 5 to 100 µm, for example, and preferably 5 to 50 µm, and the interval between each adjacent pair of wires 15 is 5 to 100 µm, for example, and preferably 5 to 50 µm.

The width W1 of each end portion conductive layer 7 is not less than 50 µm, for example, preferably not less than 200 µm, more preferably not less than 1000 µm, and not more than 10 mm in general. If the width W1 of each end portion conductive layer 7 does not satisfy the aforementioned range, adhesion between the end portion conductive layer 7 and the insulating base layer 3 may be reduced to result in conductive foreign matter.

The insulating cover layer 5 is formed on the surface of the insulating base layer 3, the side end surfaces (both width-directional side end surfaces) of the conductive thin films 8 and the surface of the conductive pattern 4 correspondingly to the conductive thin films 8 and the conductive pattern 4.

An insulating material similar to the aforementioned insulating material for the insulating base layer 3 is employed for forming the insulating cover layer 5.

The thickness of the insulating cover layer 5 is 1 to 40 µm, for example, and preferably 3 to 10 µm.

The embodiment of the method of manufacturing a wiring circuit board according to the present invention is now described with reference to FIGS. 2 to 4.

According to the method, a two-layer substrate formed by stacking the insulating base layer 3 on the metal supporting layer 2 is first prepared, as shown in FIG. 2(a).

In order to prepare the two-layer substrate, a commercially available two-layer substrate is employed as such. The two-layer substrate can be prepared by stacking the insulating base layer 3 on the surface of the metal supporting layer 2.

Then, the conductive thin films 8 and the conductive pattern 4 are successively formed on the insulating base layer 3 according to the method, as shown in FIGS. 2(b) to 4(h). The conductive thin films 8 and the conductive pattern 4 are formed by an additive process, more specifically by a semi-additive process, for example.

In order to form the conductive thin films 8 and the conductive pattern 4 by the semi-additive process, the conductive thin films 8 are first formed on the upper surface of the insulating base layer 3 and both width-directional side end surfaces of the insulating base layer 3 and the metal supporting layer 2, as shown in FIG. 2(*b*).

The conductive thin films 8 are formed by physical vapor deposition such as sputtering, vacuum evaporation or ion plating, for example, or plating such as electrolytic plating or electroless plating, for example. The conductive thin films 8 are preferably formed by physical vapor deposition, and more preferably formed by sputtering.

Thus, the conductive thin films 8 are continuously formed over the upper surface of the insulating base layer 3 and both side end surfaces of the insulating base layer 3 and the metal supporting layer 2.

Then, the conductive thin film 8 formed on the upper surface of the insulating base layer 3 and the conductive thin films 8 formed on both width-directional side end surfaces of the insulating base layer 3 and the metal supporting layer 2 are covered with photoresists 13, as shown in FIG. 2(*c*) (covering step). At the same time, a resin supporting layer 9 is formed on the lower surface of the metal supporting layer 2, to include the metal supporting layer 2 and the photoresists 13 covering both width-directional side end surfaces of the insulating base layer 3 and the metal supporting layer 2.

In order to cover the conductive thin film 8 formed on the upper surface of the insulating base layer 3 and the conductive thin films 8 formed on both width-directional side end surfaces of the insulating base layer 3 and the metal supporting layer 2 with the photoresists 13, a photoresist laminate (not shown) including a supporting layer made of polyethylene terephthalate (PET) or the like, the photoresists 13, made of negative dry film resists, stacked on the supporting layer, and a mold release layer, made of PET subjected to a mold release treatment or the like, stacked on the photoresists 13 is first prepared.

The magnitude of the photoresist laminate is set to be greater than that of the insulating base layer 3 (more specifically, the total of the width of the insulating base layer 3 and the thickness of each conductive thin film 8) and the width thereof is set to be greater than that of the insulating base layer 3 by not less than 1 mm, and more preferably by not less than 3 mm (not more than 5 mm in general), for example, in order to cover the conductive thin films 8 formed on both width-directional side end surfaces of the insulating base layer 3 and the metal supporting layer 2 with the photoresists 13. The thickness T2 of each photoresist 13 is 15 to 50 µm, for example, and preferably 15 to 25 µm.

Then, the mold release layer is separated from the photoresists 13, and the photoresist laminate is thermocompression-bonded from the supporting layer toward the photoresists 13, so that the photoresists 13 are in contact with the conductive thin film 8 formed on the upper surface of the insulating base layer 3. More specifically, the photoresist laminate is thermocompression-bonded at a temperature of 50 to 150° C., for example, and preferably at a temperature of 80 to 100° C. with a pressure of 0.20 to 0.50 MPa, for example.

Thereafter the supporting layer is separated from the photoresists 13.

In order to stack the resin supporting layer 9 on the lower surface of the metal supporting layer 2 simultaneously with the aforementioned covering with the photoresists 13, a resin supporting layer laminate (not shown) including the resin supporting layer 9, an adhesive layer stacked on the resin supporting layer 9 and a mold release layer, made of PET subjected to a mold release treatment or the like, stacked on the adhesive layer is first prepared.

The resin supporting layer 9 may be made of a resin material not inhibiting exposure (capable of transmitting light) in exposure from below described later, and is made of transparent synthetic resin such as polyethylene, polypropylene, polyethylene terephthalate (PET) or polyethylene naphthalate, for example.

The resin supporting layer laminate may have a magnitude including the metal supporting layer 2 and the conductive thin films 8 formed on both width-directional side end surfaces of the insulating base layer 3 and the metal supporting layer 2, and the width thereof is set to be greater than that of the metal supporting layer 2 by not less than 1 mm, and preferably by not less than 4 mm (not more than 10 mm in general), for example. The thickness of the resin supporting layer 9 is 25 to 150 µm, for example, and preferably 50 to 100 µm.

Then, the mold release layer is separated from the adhesive layer, and the resin supporting layer laminate is stacked so that the adhesive layer is in contact with the lower surface of the metal supporting layer 2.

Then, the photoresists 13 and the resin supporting layer 9 are simultaneously formed while the conductive thin film 8 (the conductive thin film 8 formed on the upper surface of the insulating base layer 3), the insulating base layer 3 and the metal supporting layer 2 are held between the photoresist laminate (the photoresists 13) and the resin supporting layer laminate (the resin supporting layer 9) in the thickness direction.

The photoresist 13 is thermocompression-bonded on the end edges of both width-directional end portions of the conductive thin film 8 formed on the upper surface of the insulating base layer 3, whereby the stacked photoresist 13 slips down (flows) on the surfaces of the conductive thin films 8 formed on both width-directional side end surfaces of the insulating base layer 3 and the metal supporting layer 2. Thus, defective portions (voids) 20 lacking the photoresist 13 are formed on the end edges of both width-directional side end portions of the conductive thin film 8 formed on the upper surface of the insulating base layer 3. The width of each defective portion 20 is 3 to 50 µm in general.

Portions of the photoresist 13 inside the defective portions 20 in the width direction have small thicknesses. More specifically, the portions are so formed that the thicknesses thereof are gradually reduced toward both width-directional outer sides.

The photoresists 13 covering the conductive thin films 8 formed on both width-directional side end surfaces of the insulating base layer 3 are formed to have generally trapezoidal sections gradually increased in width upward in the thickness direction, due to the aforementioned flowage in the defective portions 20.

Then, the photoresists 13 covering the conductive thin films 8 formed on both width-directional side end surfaces of the insulating base layer 3 and the metal supporting layer 2 are heated according to the method.

In order to heat the photoresists 13, the wiring circuit board 1 in the process of manufacturing covered with the photoresists 13 is heated at 60 to 150° C., for example, and preferably at 80 to 120° C., immediately after the covering step. The photoresists 13 are heated in the air or in an inactive atmosphere of nitrogen or the like, for example, for 15 to 60 seconds, for example, and preferably for 15 to 30 seconds.

Then, a photomask 10 is arranged so that both width-directional end portions and the generally central portion in the width direction (i.e., other than both width-directional end portions) to be provided with the conductive layer 6 in the conductive thin film 8 formed on the upper surface of the insulating base layer 3 and the photoresists 13 covering the conductive thin films 8 formed on both width-directional side end surfaces of the insulating base layer 3 and the metal supporting layer 2 are shaded, and the photoresist 13 covering the upper surface of the insulating base layer 3 is exposed from above through the photomask 10 according to the method, as shown in FIG. 2(d).

The photomask 10 includes a mask pattern consisting of shading portions 11 and light transmitting portions 12. The photomask 10 is arranged above the photoresists 13 at intervals, and the shading portions 11 are opposed to the photoresist 13 corresponding to the portions to be provided with the conductive layer 6 and the end portion conductive layers 7 and the photoresists 13 covering the conductive thin films 8 formed on both width-directional side end surfaces of the insulating base layer 3 and the metal layer 2 while the light transmitting portions 12 are opposed to portions (portions of reversal patterns of the conductive layer 6 and the end portion conductive layers 7) of the photoresist 13 to be provided with plating resists 14 on the upper surface of the insulating base layer 3.

In the arrangement of the photomask 10, the photoresist 13 of the portions to be provided with the end portion conductive layers 7 and the photoresists 13 covering the conductive thin films 8 formed on both width-directional side end surfaces of the insulating base layer 3 and the metal supporting layer 2 are shaded by single continuous shading portions 11.

After the arrangement of the photomask 10, the photoresist 13 is exposed from above through the photomask 10.

Light such as ultraviolet light, for example, is employed for the exposure, and the exposure dose is set to 50 to 500 mJ/cm², for example.

In the exposure of the photoresist 13 from above, the portions to be provided with the plating resists 14 are exposed, and the remaining portions (the conductive layer 6, the end portion conductive layers 7, and portions covering the conductive thin films 8 formed on both width-directional side end surfaces of the insulating base layer 3 and the metal supporting layer 2) are unexposed.

Then, the photoresists 13 covering the conductive thin films 8 formed on both width-directional side end surfaces of the insulating base layer 3 and the metal supporting layer 2 are exposed from below according to the method, as shown in FIG. 3(e).

The photoresists 13 are exposed from below through the resin supporting layer 9, without specially providing a photomask 10. In the exposure, the metal supporting layer 2 and the conductive thin films 8 formed on both width-directional side end surfaces of the insulating base layer 3 and the metal supporting layer 2 serve as photomasks.

Light such as ultraviolet light, for example, is employed for the exposure, and the exposure dose is set to 50 to 500 mJ/cm², for example.

In the exposure of the photoresists 13 from below, the photoresists 13 covering the conductive thin films 8 formed on both width-directional side end surfaces of the insulating base layer 3 and the metal supporting layer 2, i.e., portions not exposed by the exposure of the photoresist 13 from above, are exposed.

Then, unexposed portions of the photoresist 13 are removed and the exposed portions are formed into patterns to form the plating resists 14 according to the method, as shown in FIG. 3(f).

In order to form the plating resists 14 by removing the unexposed portions of the photoresist 13 and forming the exposed portions into patterns, the unexposed portions are first removed by development employing a well-known developer, and drying is thereafter performed.

Then, the end portion conductive layers 7 and the conductive layer 6 are simultaneously formed on both width-directional end portions of the conductive thin film 8 formed on the upper surface of the insulating base layer 3 and the generally central portion in the width direction of the conductive thin film 8 formed on the upper surface of the insulating base layer 3 respectively on the conductive thin film 8 exposed from the plating resists 14 according to the method, as shown in FIG. 3(g).

The end portion conductive layers 7 and the conductive layer 6 are formed by electrolytic plating or the like, for example.

In the electrolytic plating, power is supplied to the conductive thin film 8, so that the end portion conductive layers 7 and the conductive layer 6 are simultaneously deposited on the upper surface of the conductive thin film 8 exposed from the plating resists 14 and can be formed at the same time. The power is supplied to the conductive thin film 8 from a power source (not shown) through the metal supporting layer 2.

Then, the plating resists 14 and the conductive thin films 8 of the portions having been covered with the plating resists 14 are successively removed according to the method, as shown in FIG. 4(h). The plating resists 14 and the conductive thin films 8 are removed by etching or peeling, for example.

Thus, the conductive thin films 8 and the conductive pattern 4 can be formed on the insulating base layer 3.

Then, the insulating cover layer 5 is formed on the insulating base layer 3 in the aforementioned pattern, as shown in FIG. 4(i).

In order to form the insulating cover layer 5, a solution (varnish) of the aforementioned synthetic resin is uniformly applied onto the overall upper surfaces of the insulating base layer 3 and the conductive pattern 4, thereafter dried, and then hardened by heating if necessary. Alternatively, photosensitive varnish, for example, is applied to the overall upper surfaces of the insulating base layer 3 and the conductive pattern 4, dried, thereafter exposed and developed in the aforementioned pattern, and hardened by heating if necessary, in order to form the insulating cover layer 5. The insulating cover layer 5 can be formed also by previously forming synthetic resin into a film of the aforementioned pattern and sticking the film to the overall upper surfaces of the insulating base layer 3 and the conductive pattern 4 through a well-known adhesive layer, for example.

Thereafter the resin supporting layer 9 is removed by peeling or etching, for example, and preferably by peeling, as shown in FIG. 4(j).

The wiring circuit board 1 can be formed in the aforementioned manner.

According to the method, the conductive thin films 8 are formed on both width-directional side end surfaces of the insulating base layer 3 and the metal supporting layer 2, the conductive thin film 8 formed on the upper surface of the insulating base layer 3 is covered with the photoresist 13, the photomask 10 is thereafter arranged so that both width-directional end portions and the generally central portion in the width direction to be provided with the conductive layer 6 in the conductive thin film 8 formed on the upper surface of the insulating base layer 3 are shaded, and the photoresist 13 covering the conductive thin film 8 formed on the upper surface of the insulating base layer 3 is exposed from above through the photomask 10.

Then, the unexposed portions of the photoresist 13 are formed on both width-directional end portions and the generally central portion in the width direction to be provided with the conductive layer 6 in the conductive thin film 8 formed on the upper surface of the insulating base layer 3.

When the plating resists 14 are formed after the unexposed portions of the photoresist 13 are removed, the end portion conductive layers 7 can be formed on both width-directional end portions of the conductive thin film 8, exposed from the plating resists 14, formed on the upper surface of the insulating base layer 3, and the conductive layer 6 can be simultaneously formed on the generally central portion in the width direction of the conductive thin film 8, exposed from the plating resists 14, formed on the upper surface of the insulating base layer 3. Therefore, deposition of narrow conductive materials (more specifically, copper or the like) resulting from the defective portions 20 of the photoresist 13 in the electrolytic plating can be prevented and the adhesion between the end portion conductive layers 7 and the insulating base layer 3 can be improved by forming the end portion conductive layers 7 on both width-directional end portions of the conductive thin film 8 formed on the upper surface of the insulating base layer 3 while the conductive layer 6 can be formed.

Consequently, a wiring circuit board 1 having high connection reliability can be obtained by preventing formation of conductive foreign matter (more specifically, foreign matter of copper) on both width-directional end portions of the upper surface of the insulating base layer 3.

According to the method, on the other hand, the conductive thin films 8 are formed on both width-directional side end surfaces of the insulating base layer 3 and the metal supporting layer 2, the conductor films 8 formed on both width-directional side end surfaces of the insulating base layer 3 and the metal supporting layer 2 are covered with the photoresists 13, and the photoresists 13 can be exposed from below through the metal supporting layer 2 and the conductive thin films 8 formed on both width-directional side end surfaces of the insulating base layer 3 and the metal supporting layer 2 as masks. Therefore, the photoresists 13 covering the conductive thin films 8 formed on both width-directional side end surfaces of the insulating base layer 3 and the metal supporting layer 2 can be simply exposed.

Then, the plating resists 14 can be formed from the exposed portions to cover the conductive thin films 8 formed on both width-directional side end surfaces of the insulating base layer 3 and the metal supporting layer 2.

Therefore, deposition of a conductor material (more specifically, copper or the like) can be simply prevented on both width-directional side end surfaces of the insulating base layer 3 and the metal supporting layer 2, as a result, and formation of conductive foreign matter (more specifically, foreign matter of copper) can be simply prevented on both width-directional side end surfaces of the insulating base layer 3 and the metal supporting layer 2.

According to the method, the photoresists 13 covering the conductive thin films 8 formed on both width-directional side end surfaces of the insulating base layer 3 are exposed from below, and the conductive thin films 8 formed on both width-directional side end surfaces of the insulating base layer 3 can be covered with the plating resists 14 formed from the exposed portions, also when the conductive thin films 8 are formed by sputtering. Therefore, separation of the conductor material from both width-directional side end surfaces of the insulating base layer 3 along with the conductive thin films 8 can be reliably prevented.

The photoresists 13, prepared from dry film resists in the above description, can alternatively be prepared from photosensitive varnish, for example.

When the photoresist 13 prepared from the dry film resist is formed on the conductive thin film 8 formed on the upper surface of the insulating base layer 3, pressing force based on thermocompression bonding is intensively applied to end edges of both width-directional end portions of the conductive thin film 8 formed on the upper surface of the insulating base layer 3, and hence the defective portions 20 are particularly easily formed. In the formation of the conductive layer 6 by electrolytic plating, therefore, narrow conductor materials resulting from the defective portions 20 are unintentionally deposited.

However, when the photomask 10 is arranged so that both width-directional end portions of the conductive thin film 8 formed on the upper surface of the insulating base layer 3 are shaded and the photoresist 13 is exposed from above through the photomask 10 as hereinabove described, deposition of narrow conductor materials can be prevented and the adhesion between the end portion conductive layers 7 and the insulating base layer 3 can be improved by intentionally forming the end portion conductive layers 7 on the conductive thin films 8 formed on both width-directional end portions of the insulating base layer 3 even if the defective portions 20 result from the dry film resist, while the conductive layer 6 can be formed. Therefore, formation of conductive foreign matter on both width-directional end portions of the upper surface of the insulating base layer 3 can be prevented, and a wiring circuit board 1 having high connection reliability can be obtained as a result.

While the photoresists 13 are formed simultaneously with the formation of the resin supporting layer 9 on the lower surface of the metal supporting layer 2 in the above description as shown in FIG. 2(c), the photoresists 13 can also be formed without forming the resin supporting layer 9, for example, although this technique is not shown.

Preferably, the photoresists 13 are stacked simultaneously with the formation of the resin supporting layer 9. Thus, the photoresists 13 covering the conductive thin films 8 formed on both width-directional side end surfaces of the insulating base layer 3 and the metal supporting layer 2 can be supported by the resin supporting layer 9 from below, whereby the conductive thin films 8 formed on both width-directional side end surfaces of the insulating base layer 3 and the metal supporting layer 2 can be simply and reliably covered.

The metal supporting layer 2 and the insulating base layer 3 can be reinforced with the resin supporting layer 9 and the laminate thereof can be provided with toughness, whereby the conductive pattern 4 can be precisely formed.

In the above description, the photomask 10 is arranged while opposing the shading portions 11 to the photoresists 13 corresponding to the portions to be provided with the conductive layer 6 and the end portion conductive layers 7 and the photoresists 13 covering the conductive thin films 8 formed on both width-directional side end surfaces of the insulating base layer 3 and the metal supporting layer 2, as shown in FIG. 2(d). However, the present invention is not restricted to this, but the photoresist 13 corresponding to the portions to be provided with the conductive layer 6 and the end portion conductive layers 7 may simply be shaded in the arrangement of the photomask 10. For example, the portions covering the conductive thin films 8 formed on both width-directional side end surfaces of the insulating base layer 3 and the metal supporting layer 2 can be exposed by arranging a photomask 10 including a mask pattern capable of opposing shading portions 11 to the portions of the photoresist 13 corresponding to the portions to be provided with the conductive layer 6 and the end portion conductive layers 7 and exposing the photoresist 13 from above, as FIG. 10(a) is referred to.

Figure 10:
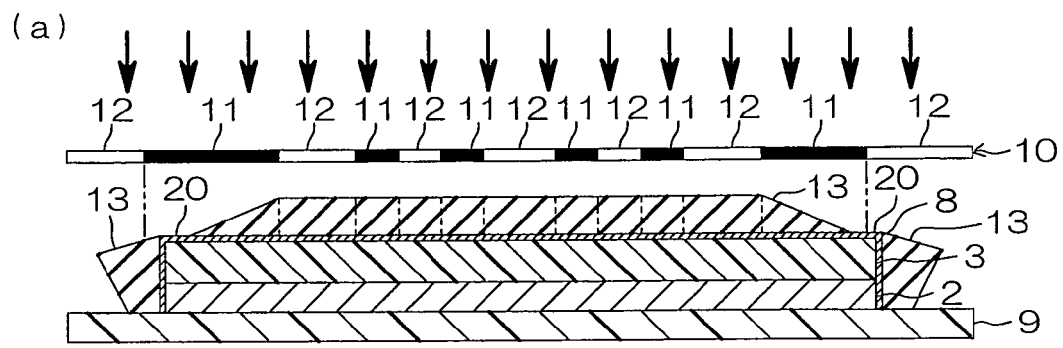
FIG. 10 are step diagrams of a method of manufacturing a COF board according to comparative example 2.
Figure 10:
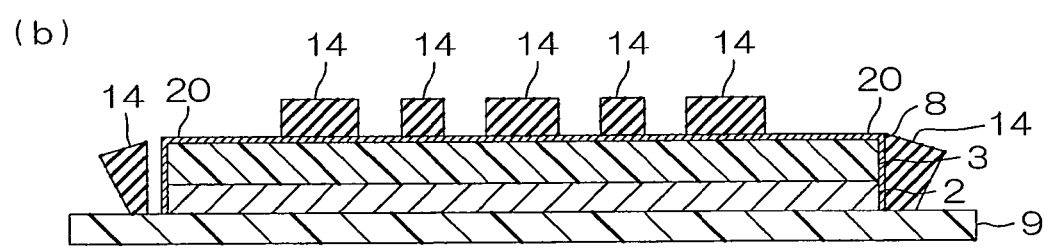
Figure 10:
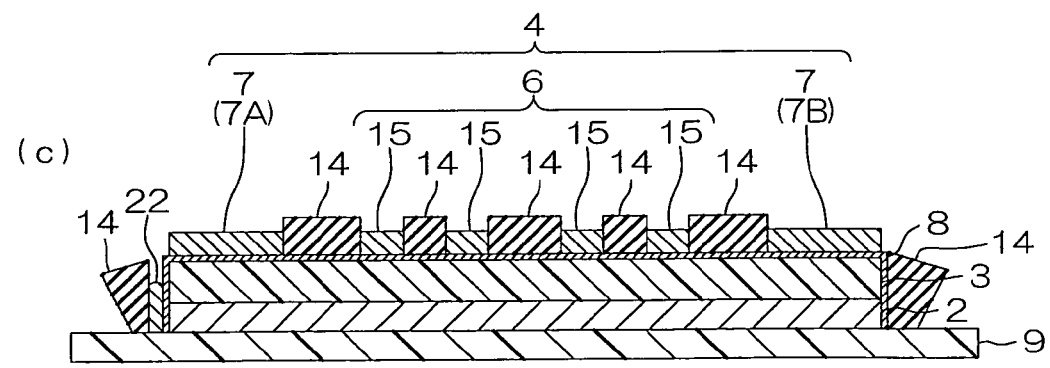

Even if the photomask 10 is displaced to result in unexposed portions in the portions covering the conductive thin films 8 formed on both width-directional side end surfaces of the insulating base layer 3 and the metal supporting layer 2 in this case as phantom lines in FIG. 10(a) are referred to, the photoresists 13 are exposed from below as shown in FIG. 3(e), and hence the unexposed portions on both width-directional sides of the insulating base layer 3 can be exposed. Therefore, deposition of conductor materials on the conductive thin films 8 formed on both width-directional side end surfaces of the insulating base layer 3 and the metal supporting layer 2 can be reliably prevented.

While the photoresists 13 are first exposed from above and thereafter exposed from below in the above description as shown in FIGS. 2(d) and 3(e), the order of the exposure is not restricted to this, but the photoresists 13 can be exposed in order reverse to the aforementioned order.

While the photoresists 13 are heated after the covering step in the above description, the photoresists 13 can be exposed without being heated after the covering step.

Preferably, the photoresists 13 are heated after the covering step.

In general, bubbles may be formed in the photoresists 13 covering the conductive thin films 8 formed on both width-directional side end surfaces of the insulating base layer 3 and the metal supporting layer 2 after the covering step. When the total thickness T1 of the metal supporting layer 2 and the insulating base layer 3, i.e., the thickness T1 of the two-layer substrate is greater than the thickness T2 of each photoresist 13, particularly when the thickness T1 of the two-layer substrate is greater than three times the thickness T2 of each photoresist 13, the aforementioned bubbles are easily formed.

However, the volumes of such bubbles can be remarkably reduced by heating the photoresists 13 covering the conductive thin films 8 formed on both width-directional side end surfaces of the insulating base layer 3 and the metal supporting layer 2 after the covering step, as hereinabove described.

Figure 5:
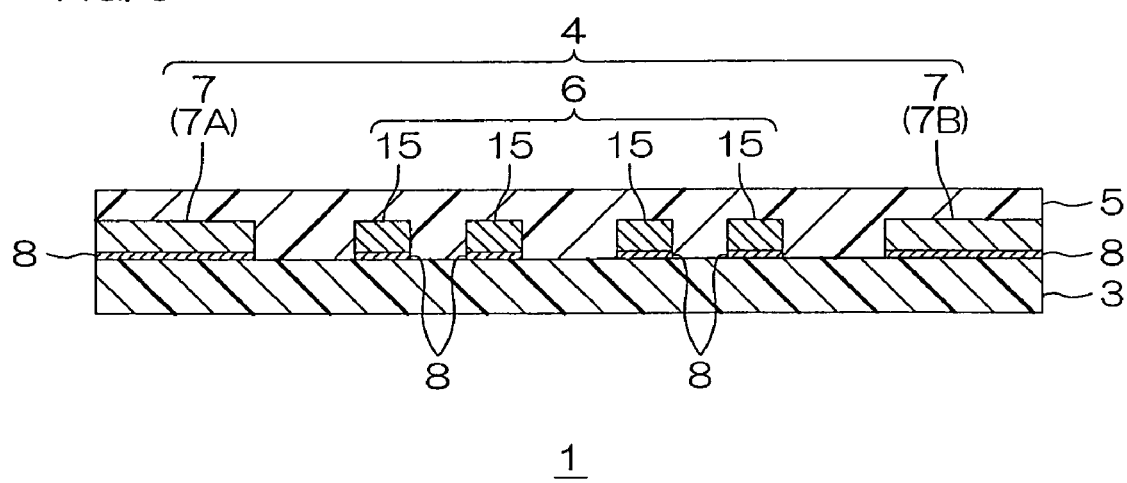
FIG. 5 is a sectional view of a wiring circuit board (in a mode including no metal supporting layer) manufactured by another embodiment of the method of manufacturing a wiring circuit board according to the present invention along a width direction.
Figure 6:
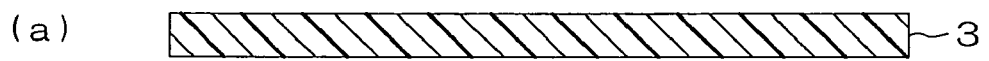
FIG. 6 are step diagrams of the embodiment of the method of manufacturing a wiring circuit board according to the present invention.
Figure 6:
Figure 6:
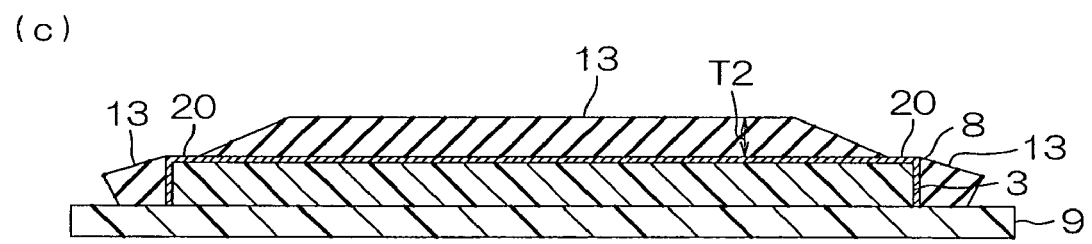
Figure 6:
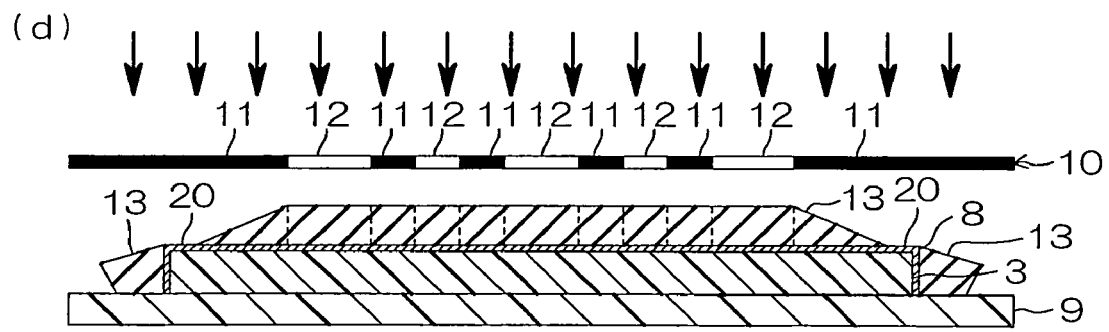
Figure 7:
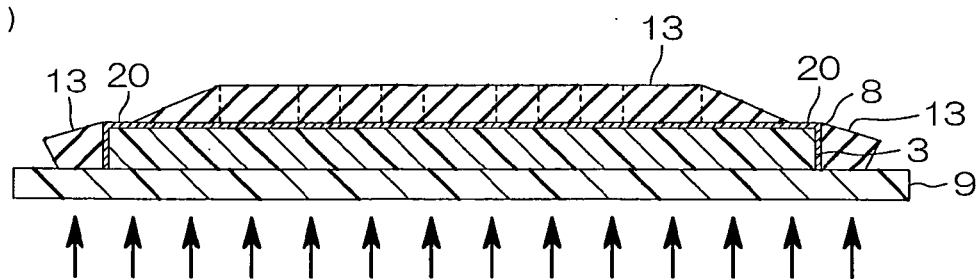
FIG. 7 are step diagrams of the embodiment of the method of manufacturing a wiring circuit board according to the present invention subsequent to FIG. 6.
Figure 7:
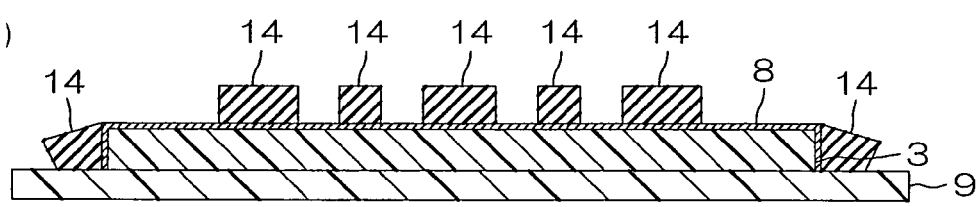
Figure 7:
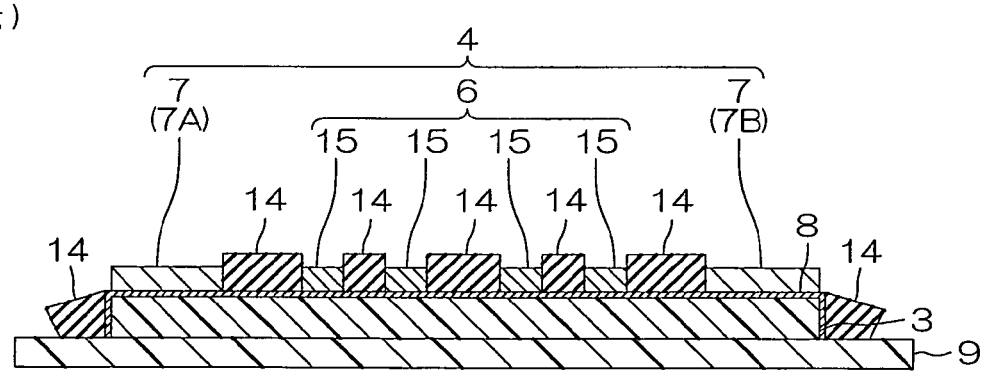
Figure 8:
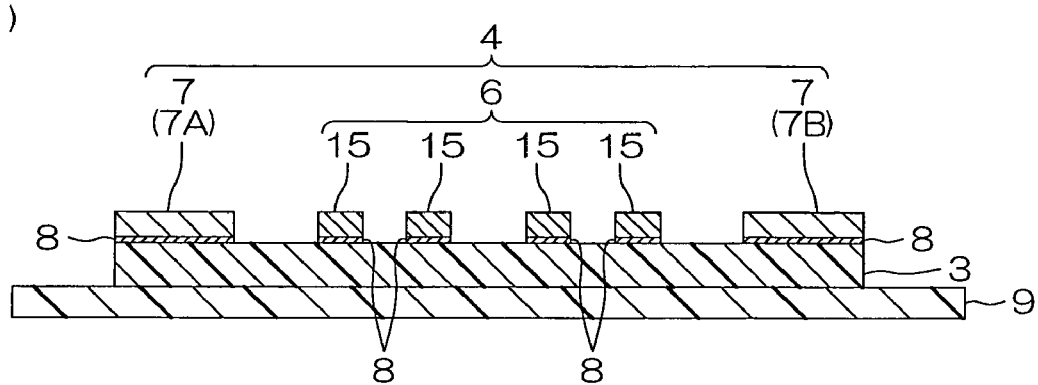
FIG. 8 are step diagrams of the embodiment of the method of manufacturing a wiring circuit board according to the present invention subsequent to FIG. 7.
Figure 8:
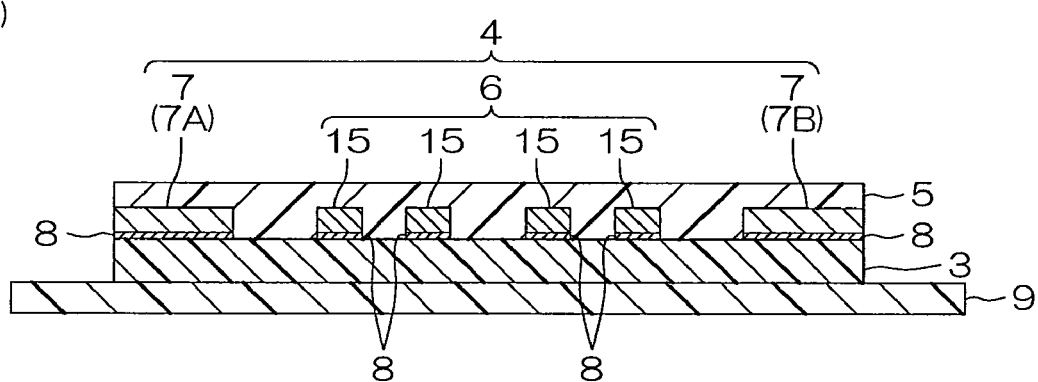
Figure 8:
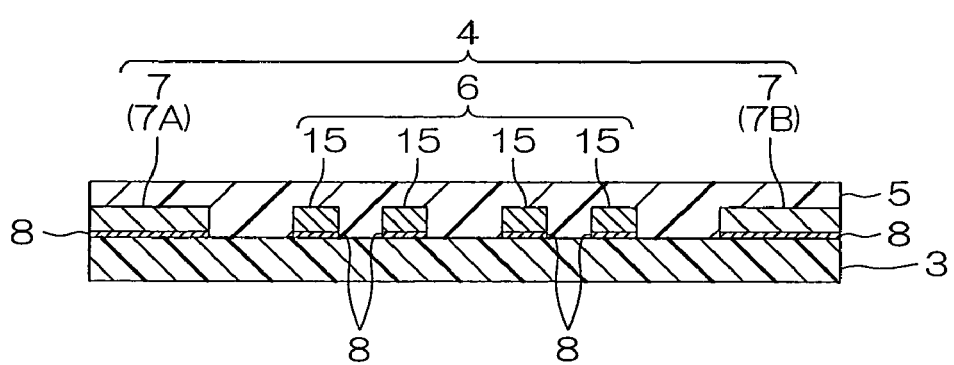

FIG. 5 is a sectional view of a wiring circuit board (in a mode including no metal supporting layer) manufactured according to another embodiment of the method of manufacturing a wiring circuit board according to the present invention, and FIGS. 6 to 8 are step diagrams of the embodiment of the method of manufacturing a wiring circuit board according to the present invention.

In the following drawings, members similar to the aforementioned ones are denoted by the same reference numerals, and redundant description thereof is omitted.

While the wiring circuit board obtained by the method of manufacturing a wiring circuit board according to the present invention is illustrated as the COF board including the metal supporting layer 2 as the reinforcing layer in the above description, the wiring circuit board obtained by the method of manufacturing a wiring circuit board according to the present invention is not restricted to this. The wiring circuit board obtained by the method of manufacturing a wiring circuit board according to the present invention can also be widely applied to another wiring circuit board such as a COF board including no metal supporting layer 2 as shown in FIG. 5, for example.

Referring to FIG. 5, a wiring circuit board 1 includes an insulating base layer 3, conductive thin films 8 formed on the insulating base layer 3, a conductive pattern 4 formed on the conductive thin films 8, and an insulating cover layer 5 formed on the insulating base layer 3 to cover the conductive thin films 8 and the conductive pattern 4.

The embodiment of the method of manufacturing a wiring circuit board according to the present invention is now described with reference to FIGS. 6 to 8.

According to the method, the insulating base layer 3 is prepared at first, as shown in FIG. 6(a). A commercially available sheet (film) can be employed as such, in order to prepare the insulating base layer 3.

Then, the conductive thin films 8 and the conductive pattern 4 are successively formed on the insulating base layer 3 by a semi-additive process according to the method, as shown in FIGS. 6(b) to 8(h).

In the semi-additive process, the conductive thin films 8 are formed on the upper surface of the insulating base layer 3 and both width-directional side end surfaces of the insulating base layer 3, as shown in FIG. 6(b). The conductive thin films 8 are formed by a method similar to the above.

Then, the conductive thin film 8 formed on the upper surface of the insulating base layer 3 and the conductive thin films 8 formed on both width-directional side end surfaces of the insulating base layer 3 are covered with photoresists 13 according to the method, as shown in FIG. 6(c) (covering step). At the same time, a resin supporting layer 9 is stacked on the lower surface of the insulating base layer 3, to include the insulating base layer 3 and the photoresists 13 covering both width-directional side end surfaces of the insulating base layer 3.

In order to cover the conductive thin film 8 formed on the upper surface of the insulating base layer 3 and the conductive thin films 8 formed on both width-directional side end surfaces of the insulating base layer 3 with the photoresists 13, the photoresists 13 are formed by a method similar to the above with the aforementioned photoresist laminate. In order to stack the resin supporting layer 9 on the lower surface of the insulating base layer 3, the resin supporting layer 9 is formed by a method similar to the above with the aforementioned resin supporting layer laminate.

Then, a photomask 10 is arranged so that both width-directional end portions and a portion to be provided with a conductive layer 6 in the conductive thin film 8 formed on the upper surface of the insulating base layer 3 and the photoresists 13 covering the conductive thin films 8 formed on both width-directional side end surfaces of the insulating base layer 3 are shaded, and the photoresist 13 covering the upper surface of the insulating base layer 3 is exposed from above through the photomask 10 according to the method, as shown in FIG. 6(d).

Then, the photoresists 13 covering the conductive thin films 8 formed on both width-directional side end surfaces of the insulating base layer 3 are exposed from below according to the method, as shown in FIG. 7(e). In the exposure, the conductive thin film 8 formed on the upper surface of the insulating base layer 3 and the conductive thin films 8 formed on both width-directional side end surfaces of the insulating base layer 3 serve as photomasks.

Then, unexposed portions of the photoresist 13 are removed and exposed portions are formed into patterns to form plating resists 14 according to the method, as shown in FIG. 7(f). Thereafter end portion conductive layers 7 and the conductive layer 6 are simultaneously formed on both width-directional end portions of the conductive thin film 8 formed on the upper surface of the insulating base layer 3 and a generally central portion in the width direction of the conductive thin film 8 formed on the upper surface of the insulating base layer 3 respectively on the conductive thin film 8 exposed from the plating resists 14 according to the method, as shown in FIG. 7(g).

Then, the plating resists 14 and the conductive thin films 8 of the portions having been covered with the plating resists 14 are successively removed according to the method, as shown in FIG. 8(h). Thereafter the insulating cover layer 5 is formed on the insulating base layer 3 in the aforementioned pattern, as shown in FIG. 8(i). Thereafter the resin supporting layer 9 is removed, as shown in FIG. 8(j).

Thus, the wiring circuit board 1 including no metal supporting layer 2 can be formed.

As the method of manufacturing a wiring circuit board according to the present invention, the aforementioned method of manufacturing the wiring circuit board 1 including the metal supporting layer 2 shown in FIGS. 2 to 4 is preferably employed.

In other words, the two-layer substrate formed by stacking the insulating base layer 3 on the metal supporting layer 2 is prepared as shown in FIG. 2(a) in the method of manufacturing the wiring circuit board 1 shown in FIGS. 2 to 4, whereby the insulating base layer 3 can be reinforced with the metal supporting layer 2. Therefore, the conductive pattern 4 can be precisely formed.

The conductive thin films 8 are formed on both width-directional side end surfaces of the insulating base layer 3 and the metal supporting layer 2 as shown in FIG. 2(b), the conductive thin films 8 formed on both width-directional side end surfaces of the insulating base layer 3 and the metal supporting layer 2 are covered with the photoresists 13 as shown in FIG. 2(c), and the photoresists 13 can be exposed from below through the metal supporting layer 2 and the conductive thin films 8 formed on both width-directional side end surfaces of the insulating base layer 3 and the metal supporting layer 2 as masks, as shown in FIG. 3(e).

Thus, only the photoresists 13 formed on both width-directional side end surfaces of the insulating base layer 3 and the metal supporting layer 2 can be simply and reliably exposed.

While the wiring circuit board 1 including no metal supporting layer 2 shown in FIG. 5 is manufactured by the method shown in FIGS. 6(a) to 8(j), the wiring circuit board 1 can also be formed by the method shown in FIGS. 2(a) to 4(j), i.e., by obtaining the wiring circuit board 1 supported by the metal supporting layer 2 and including the insulating base layer 3, the conductive thin films 8, the conductive pattern 4 and the insulating cover layer 5 and thereafter removing the metal supporting layer 2 by etching, for example.

EXAMPLES

While the present invention is now more specifically described with reference to Examples and comparative examples, the present invention is not restricted to Examples and comparative examples at all.

(Manufacturing COF Board including Metal Supporting Board)

Example 1

First, a two-layer substrate (having a thickness T1 of 60 μm and a width of 300 mm) formed by stacking an insulating base layer made of polyimide having a thickness of 35 μm on a metal supporting layer made of stainless having a thickness of 25 μm was prepared (see FIG. 2(a)).

Then, chromium thin films each having a thickness of 0.02 μm and copper thin films each having a thickness of 0.13 μm were successively formed as conductive thin films on the upper surface of the insulating base layer and both width-directional side end surfaces of the insulating base layer and the metal supporting layer to be continuous there with by chromium sputtering and copper sputtering (see FIG. 2(b)).

Then, a photoresist laminate (having a width of 303 mm) formed by successively stacking a supporting layer, a negative photoresist (having a thickness T2 of 15 μm) and a mold release layer was prepared, the mold release layer was thereafter separated from the photoresist laminate, and the photoresist laminate was thermocompression-bonded at a temperature of 90° C. with a pressure of 0.3 MPa so that the photoresist was in contact with the conductive thin film formed on the upper surface of the insulating base layer.

A resin supporting layer laminate (having a width of 304 mm) formed by successively stacking a resin supporting layer (having a thickness of 50 μm), an adhesive layer and a mold release layer was separately prepared, the mold release layer was thereafter separated from the resin supporting layer laminate, and the resin supporting layer laminate was stacked simultaneously with the aforementioned thermocompression bonding of the photoresist laminate, so that the adhesive layer was in contact with the lower surface of the metal supporting layer.

Thus, the conductive thin film formed on the upper surface of the insulating base layer and the conductive thin films formed on both width-directional side end surfaces of the insulating base layer and the metal supporting layer were covered with photoresists, and the resin supporting layer was simultaneously stacked on the lower surface of the metal supporting layer to include the metal supporting layer and the photoresists covering the conductive thin films formed on both width-directional side end surfaces of the insulating base layer and the metal supporting layer (see FIG. 2(c)).

Immediately after the covering with the photoresists, the photoresists were heated at 90° C. for 20 seconds in the air.

Then, a photomask was arranged so that both width-directional end portions to be provided with end portion conductive layers and a generally central portion in the width direction to be provided with a conductive layer in the conductive thin film formed on the upper surface of the insulating base layer and portions provided with the photoresists covering the conductive thin films formed on both width-directional side end surfaces of the insulating base layer and the metal supporting layer were shaded. Then, the photoresist covering the conductive thin film formed on the upper surface of the insulating base layer and the photoresists covering the conductive thin films formed on both width-directional side end surfaces of the insulating base layer and the metal supporting layer were exposed from above through the photomask.

The photomask included a mask pattern consisting of shading portions and light transmitting portions. The shading portions were opposed to the photoresists corresponding to the portions to be provided with the conductive layer and the end portion conductive layers and the photoresists covering the conductive thin films formed on both width-directional side end surfaces of the insulating base layer and the metal layer while the light transmitting portions were opposed to portions to be provided with plating resists covering the conductive thin film formed on the upper surface of the insulating base layer, and the photoresists were exposed from above through the photomask with ultraviolet light at 130 mJ/cm$^2$ (see FIG. 2(d)).

Then, the photoresists covering the conductive thin films formed on both width-directional side end surfaces of the insulating base layer and the metal supporting layer were exposed from below with ultraviolet light at 260 mJ/cm$^2$ (see FIG. 3(e)).

Then, unexposed portions of the photoresist were removed and the exposed portions were formed into patterns thereafter dried, to form the plating resists (see FIG. 3(f)).

Then, the end portion conductive layers and the conductive layer were simultaneously formed on both width-directional end portions of the conductive thin film formed on the upper surface of the insulating base layer and the width-directional center of the conductive thin film formed on the upper surface of the insulating base layer respectively on the conductive thin film exposed from the plating resists by electrolytic copper plating (see FIG. 3(g)). The thickness of the conductive pattern (the end portion conductive layers and the conductive layer) was about 9 μm, and the width (W1) of each end portion conductive layer was 5000 μm.

Then, the plating resists and the conductive thin films of the portions having been covered with the plating resists were successively removed (See FIG. 4(h)).

Then, varnish of photosensitive polyamic resin was uniformly applied to the overall upper surfaces of the insulating base layer and the conductive pattern, dried, thereafter exposed and developed and further hardened by heating, thereby forming an insulating cover layer made of polyimide having a thickness of 5 μm in the aforementioned pattern (see FIG. 4(i)).

Thereafter the resin supporting layer was removed by peeing (see FIGS. 1 and 4(j)).

Thus, a COF board including the metal supporting layer was obtained.

Comparative Example 1

Figure 9:
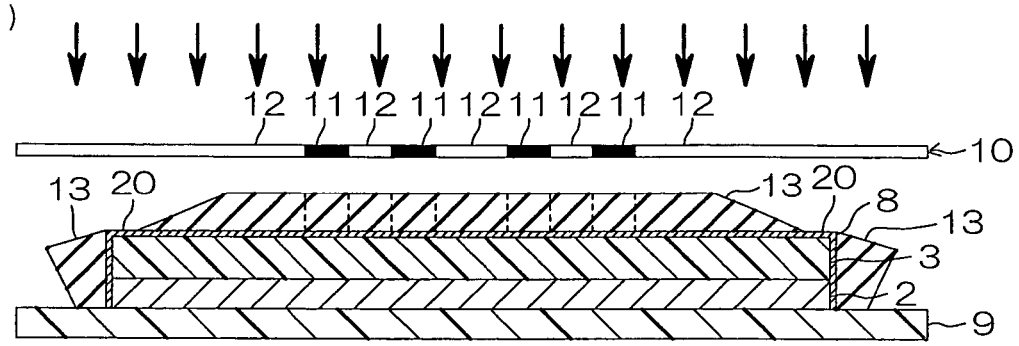
FIG. 9 are step diagrams of a method of manufacturing a COF board according to comparative example 1.
Figure 9:
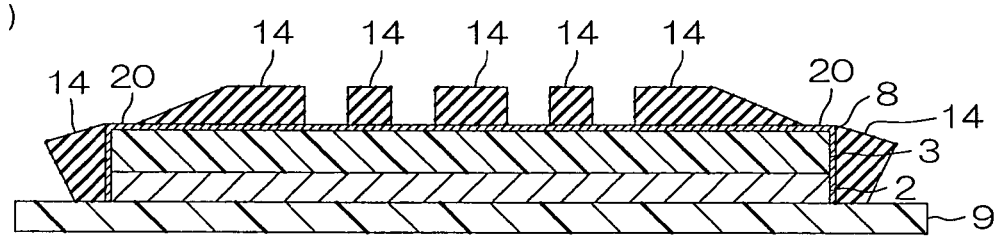
Figure 9:
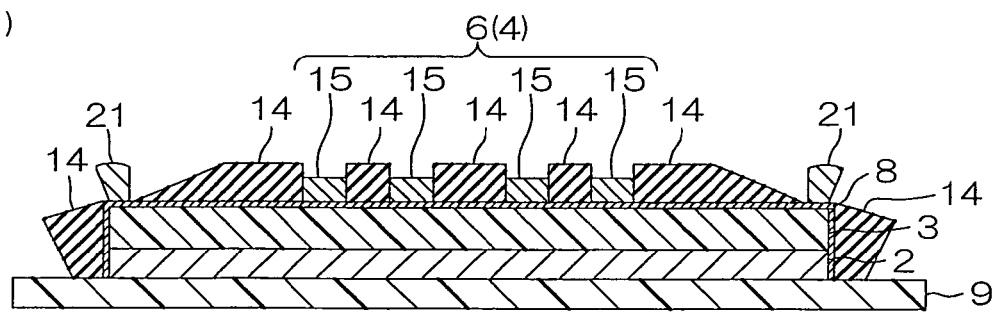

As shown in FIG. 9(a), a COF board (1) was obtained by performing treatments similar to those in Example 1 (see FIGS. 9(b) and 9(c)) except that a photomask (10) was arranged so that only a portion at the width-directional center to be provided with a conductive layer (6) was shaded and a photoresist (13) covering a conductive thin film (8) formed on the upper surface of an insulating base layer (3) and photoresists (13) covering conductive thin films (8) formed on both width-directional side end surfaces of the insulating base layer (3) and a metal supporting layer (2) were exposed from above through the photomask (10) in exposure of the photoresists (13) from above.

As shown in FIG. 9(a), the aforementioned photomask (10) was arranged so that shading portions (11) were opposed to the photoresist (13) for forming the conductive layer (6) and light transmitting portions (12) were opposed to the photoresists (13) covering the conductive thin films (8) formed on both width-directional side end surfaces of the insulating base layer (3) and the metal supporting layer (2) and the photoresist (13) of portions to be provided with plating resists (14) covering the conductive thin film (8) formed on the upper surface of the insulating base layer (3).

Comparative Example 2

As shown in FIG. 10(a), a COF board (1) was obtained by performing treatments similar to those in Example 1 (see FIGS. 10(b) and 10(c)) except that a photomask (10) was arranged so that only portions to be provided with a conductive layer (6) at the width-directional center and end portion conductive layers (7) on both width-directional end portions were shaded and a photoresist (13) covering a conductive thin film (8) formed on the upper surface of an insulating base layer (3) and photoresists (13) covering conductive thin films (8) formed on both width-directional side end surfaces of the insulating base layer (3) and a metal supporting layer (2) were exposed from above through the photomask (10) in exposure of the photoresists (13) from above while no exposure from below was executed (see FIG. 3(e)).

As shown in FIG. 10(a), the aforementioned photomask (10) was arranged so that shading portions (11) were opposed to the photoresist (13) for forming the conductive layer (6) and the end portion conductive layers (7) and light transmitting portions (12) were opposed to the photoresists (13) covering the conductive thin films (8) formed on both width-directional side end surfaces of the insulating base layer (3) and the metal supporting layer (2) and the photoresist (13) of portions to be provided with plating resists (14) covering the conductive thin film (8) formed on the upper surface of the insulating base layer (3).

However, the photomask (10) was slightly displaced to a first width-directional side as shown by phantom lines in FIG. 10(a), and hence the shading portion (11) was opposed to a portion in contact with the conductive thin film (8) formed on first width-directional end surfaces of the insulating base layer (3) and the metal supporting layer (2) in the photoresist (13) covering the conductive thin film (8) formed on the first width-directional end surfaces of the insulating base layer (3) and the metal supporting layer (2), and the portion was removed by development, as shown in FIG. 10(b).

Therefore, copper (22) of 10 to 50 μm in width was deposited on the conductive thin film (8) formed on the first width-directional end surface of the metal supporting layer (2) in electrolytic copper plating.

(Manufacturing COF Board including No Metal Supporting Board)

Example 2

A sheet (having a width of 300 mm) of an insulating base layer made of polyimide having a thickness of 35 μm was prepared (see FIG. 6(a)).

Then, chromium thin films each having a thickness of 0.02 μm and copper thin films each having a thickness of 0.13 μm were successively formed as conductive thin films on the upper surface of the insulating base layer and both width-directional side end surfaces of the insulating base layer to be continuous therewith by chromium sputtering and copper sputtering (see FIG. 6(b)).

Then, a photoresist laminate similar to that in Example 1 was thermocompression-bonded so that a photoresist was in contact with the conductive thin film formed on the upper surface of the insulating base layer.

A resin supporting layer laminate similar to that in Example 1 was separately stacked simultaneously with the aforementioned thermocompression bonding of the photoresist laminate, so that an adhesive layer was in contact with the lower surface of the insulating base layer.

Thus, the conductive thin films formed on the upper surface of the insulating base layer and both width-directional side end surfaces of the insulating base layer were covered with photoresists, while a resin supporting layer was simultaneously stacked on the lower surface of the insulating base layer to include the insulating base layer and the conductive thin films formed on both width-directional side end surfaces of the insulating base layer (see FIG. 6(c)).

Immediately after the covering with the photoresists, the photoresists were heated at 90° C. for 20 seconds in the air.

Then, a photomask was arranged similarly to that in Example 1, and the photoresist covering the conductive thin film formed on the upper surface of the insulating base layer and the photoresists covering the conductive thin films formed on both width-directional side end surfaces of the insulating base layer were exposed from above through the photomask (see FIG. 6(d)).

Then, the photoresists covering the conductive thin films formed on both width-directional side end surfaces of the insulating base layer were exposed from below under conditions similar to those in Example 1 (see FIG. 7(e)), and treated similarly to Example 1, to form plating resists (see FIG. 7(f)).

Then, end portion conductive layers and a conductive layer were simultaneously formed by electrolytic copper plating under conditions similar to those in Example 1 (see FIG. 7(g)), and the plating resists and the conductive thin films of portions having been covered with the plating resists were successively removed by etching (see FIG. 8(h)).

Then, an insulating cover layer was formed in the aforementioned pattern, similarly to Example 1 (see FIG. 8(i)). Thereafter the resin supporting layer was removed by peeling (see FIGS. 5 and 8(j)).

Thus, a COF board including no metal supporting layer was obtained.

(Evaluation)

1) Foreign Matter of Copper on End Portion of Upper Surface of Insulating Base Layer In the COF boards obtained according to Examples 1 and 2 and comparative examples 1 and 2, both width-directional end portions of the conductive thin films formed on the upper surfaces of the insulating base layers were observed with a metallograph and an SEM.

Consequently, it has been confirmed that end portion conductive layers were formed on both width-directional end portions of the insulating base layers in Examples 1 and 2 and comparative example 2.

In comparative example 1, on the other hand, it has been confirmed that copper (21) was unintentionally deposited on end edges of both width-directional end portions of the upper surface of the insulating base layer (3) on the basis of defective portions (20) of plating resists (14) and the copper (21) was peeled to form foreign matter of copper.

2) Deposition of Copper on Side End Surface of Insulating Base Layer

In the COF boards obtained according to Examples 1 and 2 and comparative examples 1 and 2, both width-directional side end surfaces of the metal supporting layers were observed with a metallograph and an SEM.

Consequently, it has been confirmed that no copper was deposited in Examples 1 and 2 and comparative example 1.

In comparative example 2, on the other hand, it has been confirmed that copper (22) was deposited on the first width-directional side end surface (the left side end surface in FIG. 10(c)) of the metal supporting layer (2) and separated from the first width-directional side end surface of the insulating base layer (3) along with the conductive thin film (8) to form foreign matter of copper.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of manufacturing a wiring circuit board, comprising:
   preparing an insulating layer;
   forming conductive thin films on the upper surface and the side end surface of the insulating layer;
   covering the conductive thin films formed on the upper surface and the side end surface of the insulating layer with photoresists;
   arranging a photomask so that an end portion and a portion to be provided with a conductive layer in the conductive thin film formed on the upper surface of the insulating layer are shaded and exposing the photoresist covering the conductive thin film formed on the upper surface of the insulating layer from above through the photomask;
   exposing the photoresist covering the conductive thin film formed on the side end surface of the insulating layer from below;
   forming plating resists by removing unexposed portions of the photoresists so as to form exposed portions into patterns;
   forming an end portion conductive layer on the end portion of the conductive thin film formed on the upper surface of the insulating layer, and forming the conductive layer on the conductive thin film formed on the upper surface of the insulating thin film at the same time, on the conductive thin films exposed from the plating resists,;
   removing the plating resists; and
   removing the conductive thin films having been covered with the plating resists.

2. The method of manufacturing a wiring circuit board according to claim 1, wherein
   the conductive thin film is formed by sputtering in the step of forming the conductive thin film.

3. The method of manufacturing a wiring circuit board according to claim 1, wherein
   a two-layer substrate formed by stacking the insulating layer on a metal supporting layer is prepared in the step of preparing the insulating layer,
   the conductive thin films are formed on the upper surface of the insulating layer and the side end surfaces of the insulating layer and the metal supporting layer in the step of forming the conductive thin films,
   the conductive thin film formed on the upper surface of the insulating layer and the conductive thin film formed on the side end surfaces of the insulating layer and the metal supporting layer are covered with the photoresists in the step of covering the conductive thin films with the photoresists, and
   the photoresist covering the conductive thin film formed on the side end surfaces of the insulating layer and the metal supporting layer is exposed from below in the step of exposing the photoresist from below.

4. The method of manufacturing a wiring circuit board according to claim 1, wherein
   the photoresist is prepared from a dry film resist.

5. The method of manufacturing a wiring circuit board according to claim 1, wherein
   a resin supporting layer is stacked under the insulating layer to include the photoresist covering the conductive thin film formed on the side end surface of the insulating layer in the step of covering the conductive thin films with the photoresists.

6. The method of manufacturing a wiring circuit board according to claim 1, further comprising a step of heating the photoresist covering the conductive thin film formed on the side end surface of the insulating layer after the step of covering the conductive thin films with the photoresists.

* * * * *